United States Patent
Martin, II et al.

[11] Patent Number: 5,939,371
[45] Date of Patent: Aug. 17, 1999

[54] STRIPPING COMPOSITION FOR URETHANE CONFORMAL COATINGS

[76] Inventors: Richard P. Martin, II; Rosemary Martin, both c/o R. & E. Martin 2817-21 Helen St. P.O. Box 4710, Philadelphia, Pa. 19134

[21] Appl. No.: 08/949,313

[22] Filed: Oct. 14, 1997

[51] Int. Cl.⁶ .............................. C11D 3/18; C11D 3/20; C11D 3/30; C11D 3/37
[52] U.S. Cl. .............................. 510/175; 134/1.3
[58] Field of Search ................... 510/201, 202, 510/203, 204, 205, 206, 207, 208, 209, 210, 211, 212, 213, 175; 134/1.3

[56] References Cited

U.S. PATENT DOCUMENTS

| | | | |
|---|---|---|---|
| 3,625,763 | 12/1971 | Melillo | 134/38 |
| 4,395,479 | 7/1983 | Ward et al. | 430/258 |
| 4,732,695 | 3/1988 | Francisco | 252/162 |
| 4,741,784 | 5/1988 | Roeser | 134/38 |
| 4,749,510 | 6/1988 | Nelson | 252/166 |
| 5,011,621 | 4/1991 | Sullivan | 252/162 |
| 5,015,410 | 5/1991 | Sullivan | 252/166 |
| 5,098,591 | 3/1992 | Stevens et al. | 252/162 |
| 5,100,942 | 3/1992 | Hegedus et al. | 524/204 |
| 5,229,210 | 7/1993 | Kasukawa et al. | 428/416 |
| 5,288,335 | 2/1994 | Stevens | 134/38 |
| 5,330,788 | 7/1994 | Roberts | 427/154 |
| 5,399,282 | 3/1995 | Hansen et al. | 252/162 |
| 5,501,761 | 3/1996 | Evens et al. | 156/344 |
| 5,604,193 | 2/1997 | Vlasblom | 510/212 |
| 5,629,277 | 5/1997 | Plishka | 510/202 |

*Primary Examiner*—John R. Hardee
*Attorney, Agent, or Firm*—Paul & Paul

[57] ABSTRACT

A stripping composition for urethane conformal coatings includes about 18 weight percent d-limonene; about 9 weight percent monoethanolamine; about 18 weight percent aromatic distilled spirits; about 30 weight percent dipropylene glycol monomethyl ether; about 23 weight percent polyethylene glycol having an average molecular weight of about 300; and about 2 weight percent fumed silica.

19 Claims, No Drawings

STRIPPING COMPOSITION FOR URETHANE CONFORMAL COATINGS

BACKGROUND OF THE INVENTION

1. Field of the Invention

The present invention concerns a composition for use in removing urethane-based conformal coatings from printed circuit boards.

2. Background of the Invention

As the cost of sophisticated electronic chips continues to decline, many new applications have been found, including applications in adverse and challenging environments. Such chips are typically installed with other electronic components on printed circuit boards (PCBs). When PCBs are installed in adverse environments, their components must be protected. An important way of protecting PCBs is to dip or coat them in a material which forms, when cured, a resistant protective coating. Because such coatings conform to the general shape of the PCB components, they are often referred to as "conformal" coatings. One important, widely used type of conformal coating is polyurethane, such as that formed from moisture-cured urethane pre-polymer compositions.

An especially challenging new environment for PCBs is in the engine compartment of automobiles and other vehicles, where they guide operation of the engine and other automotive systems. Polyurethane conformal coatings have been used to protect automotive PCB from heat, humidity and other adverse environmental factors.

Servicing autos equipped with PCBs protected by conformal coatings presents a difficult problem. Where the operation of the vehicle has been impaired because of a damaged, defective or failed component on the PCB, even a very inexpensive component, the entire board is typically replaced, at substantial expense. The conformal coating makes isolation and replacement of the failed component difficult. Because the conformal coating is engineered to resist damaging environmental factors, it also typically resists chemicals otherwise effective at stripping coatings. Thus, very potent and potentially hazardous acids, bases, and/or organic solvents have been used to remove conformal coatings. Often removal is a very labor-intensive, and therefore expensive process, involving physically scraping the coating off the PCB. After a motorist's problem has been solved by replacing a failed PCB with a new one, the old PCB may be discarded although the defect may be very minor, and the value of the other components is lost.

Prior art stripping compositions for conformal coatings tend to employ highly toxic and/or highly corrosive materials. For example, U.S. Pat. No. 3,625,763 discloses a conformal coating stripping method and composition which includes a large proportion of a polychlorinated aliphatic liquid. U.S. Pat. No. 4,741,784 discloses a composition and method for removing conformal coatings such as polyurethane or epoxy from PCBs. A two-part composition is employed. The base component comprises toluene and/or methylene chloride. While conformal coating stripping compositions based on the less-toxic N-methylpyrrolidone are also available, they tend to act more slowly. U.S. Pat. No. 5,501,761 discloses a method of stripping conformal coatings from PCB using supercritical carbon dioxide. However, this method requires special high pressure processing equipment which is not generally available.

Thus, there is a need for a stripping composition which can rapidly remove urethane conformal coatings from PCBs, without requiring excessive labor, or the use of chemicals known to be hazardous, such as methylene chloride, or expensive equipment.

SUMMARY OF THE INVENTION

The present invention provides a stripping composition especially effective for urethane conformal coatings on PCBs. The stripping composition immediately wets out the surface of a polyurethane conformal coating, and is fast acting, with conformal coatings in some cases being removable within 15 minutes after treatment. Advantageously, the stripping composition of the present invention can be formulated to provide a rheology permitting spray application, thereby avoiding dip application.

The stripping composition of the present invention comprises a mixture of components including:

a) from about 5 to 50 weight percent of a terpene having at least 10 carbon atoms;

b) from about 3 to 15 weight percent of an organic amine accelerator;

c) from about 8 to 32 percent by weight of a hydrocarbon solvent;

d) from about 20 to 40 weight percent of a glycol ether coupling agent; and e) from about 13 to 35 weight percent of a polyalkylene glycol.

Preferably, the stripping composition also includes a thixatropic thickening agent in sufficient quantity to provide an appropriate rheology for spray application.

In a presently preferred embodiment, the stripping composition of the present invention comprises:

a) from about 8 to 28 weight percent d-limonene;

b) from about 6 to 12 weight percent monoethanolamine;

c) from about 8 to 32 weight percent aromatic distilled spirits;

d) from about 25 to 28 weight percent dipropylene glycol monomethyl ether;

e) from about 18 to 30 weight percent polyethylene glycol having an average molecular weight of from about 150 to 1000; and f) from about 1 to 3 weight percent fumed silica.

An especially preferred present embodiment of the stripping composition of the present invention comprises:

a) about 18 weight percent d-limonene;

b) about 9 weight percent monoethanolamine;

c) about 18 weight percent aromatic distilled spirits;

d) about 30 weight percent dipropylene glycol monomethyl ether;

e) about 23 weight percent polyethylene glycol having an average molecular weight of about 300; and f) about 2 weight percent fumed silica.

DETAILED DESCRIPTION OF THE PREFERRED EMBODIMENTS

While not intending to be bound by any particular theory or explanation of the operation of the stripping composition of the present invention, is presently believed that the composition includes several components which act to solubilize the polyurethane conformal coating, namely, d-limonene, the aromatic mineral spirits, and the polyethylene glycol, and that the glycol ether acts as a coupling agent or cosolvent.

The proportion and type of glycol ether employed are important. If too little glycol ether is used, the composition tends to separate, while an excess tends to decrease the rate at which the conformal coating is stripped. Further, if the glycol ether employed in the composition has too low a molecular weight, the flash point of the composition can be undesirably decreased. Similarly, if the glycol ether employed has too high a molecular weight, the effectiveness of the stripping composition is impaired.

As an active ingredient, the composition of the present invention preferably includes a terpene having at least 10 carbon atoms. The terpene is a terpene hydrocarbon, terpene alcohol, or mixture thereof. Examples of terpenes which can be used in the stripping compositions of the present invention include as d-limonene, alpha-terpinene, beta-pinene, citronellal, citronellol, hydroxycitronellal, linalool, gamma-terpinene, tetrahydralinalool, terpinol, dipentene, and the like. Mixtures of terpenes such as pine oil can also be employed. d-Limonene is especially preferred. Stripping compositions of the present invention preferably comprise from about 5 to 50 weight percent of a terpene having at least 10 carbon atoms, and preferably from about 8 to 28 weight percent. A composition containing about 18 percent by weight of d-limonene is especially preferred. d-Limonene is available from PDN Corporation of Wilmington, Del. 19810.

The stripping composition of the present invention also includes an alkaline accelerator, preferably, an organoamine, to aid in solubilizing and swelling the conformal coating, by modifying the pH of the stripping composition and acting as a solvent. The amine accelerator is preferably a hydroxyamine, such monoethanolamine, monopropanolamine, diethanolamine, diethylethanolamine, triethanolamine, triisopropanolamine, or the like. Monoethanolamine is presently preferred. Alternatively, an organic amine such as ethylamine, ethylenediamine, isopropylamine, morpholine, triethylenetetramine, or the like can be used. The amount of amine accelerator employed depends on the type and functionality of the accelerator, but generally is from about 3 to 15 weight percent of the composition. When monoethanolamine is used as the accelerator, the stripping composition preferably include from 6 to 12 weight percent monoethanolamine, with about 9 weight percent being especially preferred.

Preferably, the flash point of the composition is no lower than about 100 degrees Fahrenheit.

The composition of the present invention also includes a solvent, such as a hydrocarbon solvent, for the other components. Preferably, a high flash point solvent is employed, in order to reduce the evaporation rate and increase the working life of the stripping composition. Preferably, a high flash point aromatic hydrocarbon solvent is employed. An especially preferred solvent is aromatic distilled spirits, having a flash point of a minimum of 100 degrees Fahrenheit and available from Exxon Chemicals, Bayonne, N.J. as A-100 naphtha. The stripping composition preferably includes from 8 to 28 percent by weight of solvent. A stripping composition containing from about 13 to 22 weight percent aromatic distilled spirits is preferred, and about 18 weight percent aromatic distilled spirits is especially preferred.

The present composition also includes a coupling agent or cosolvent component such as a glycol ether. Examples of glycol ethers which can be used in the present composition include alkylene glycol ethers such as ethylene glycol monomethyl ether, ethylene glycol monoethyl ether, ethylene glycol monopropyl ether, ethylene glycol monobutyl ether, ethylene glycol monohexyl ether, diethylene glycol monomethyl ether, diethylene glycol monoethyl ether, diethylene glycol monobutyl ether, triethylene glycol monomethyl ether, propylene glycol monomethyl ether, propylene glycol monoethyl ether, propylene glycol monobutyl ether, dipropylene glycol monomethyl ether, dipropylene glycol monoethyl ether, dipropylene glycol mono-t-butyl ether, dipropylene glycol monohexyl ether, tripropylene glycol monomethyl ether, etc. Dipropylene glycol monomethyl ether is preferred. The stripping composition preferably includes from about 20 to 40 weight percent coupling agent. When dipropylene glycol monomethyl ether is employed as the coupling agent, it is preferably included as from about 25 to 35 weight percent of the stripping composition, more preferably at about 30 weight percent. Ester derivatives of glycol ethers, such as dipropylene glycol monomethyl ether acetate, can also be used.

In addition, the present composition preferably includes a polymeric polyalkylene glycol. The polyalkylene glycol can be a polymerized from ethylene oxide (giving a polyethylene glycol), propylene oxide (giving a polypropylene glycol), or from a mixture of ethylene oxide and propylene oxide (giving a block copolymer).

The polyalkylene glycol has the general formula:

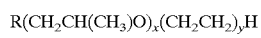

where R is $C_{2-20}$ alkyl, polyhydroxy-substituted $C_{2-10}$ alkyl, $C_{6-20}$ aryl, and $C_{7-30}$ alkylaryl, x is an integer from 0 to 75; and y is an integer from 1 to 100, and x is less than or equal to y.

The molecular weight of the resulting polymer is dependent on chain length, and can vary from about 150 to 10,000. Preferably, a polyethylene glycol having a low average molecular weight, preferably from about 150 to 1000, and more preferably about 300, is used. The polyethylene glycol has a solvent action in the present stripping composition. If the polyethylene glycol employed has too high a molecular weight, the solvent action can be lost. Conversely, it the polyethylene glycol employed has too low a molecular weight, it will not solubilize the urethane coating. Preferably, the stripping composition includes from about 13 to 35 weight percent of the polyalkylene glycol, more preferably from about 18 to 30 weight percent, and most preferably about 23 weight percent.

Depending on the mode of intended application of the stripping composition, a thickener may also be included in the composition. For example, if the stripping composition is to be used by filing a tank with the stripping composition, and then dipping PCBs in the stripping composition for removal of conformal coatings on the PCBs, then a thickener need not be employed. On the other hand, if the stripping composition is to be applied to the surface of a PCB by spray, brush or a similar method, then it is preferable to thicken the stripping composition to prevent the composition from flowing off the PCB, so that the stripping composition maintains contact with the surface of the PCB long enough to loosen the conformal coating. Preferably, the stripping composition is applied by spraying the surface of the PCB.

Any conventional thickening agent can be employed to thicken the stripping composition, provided the thickening agent is stable and non-reactive with the other components of the stripping composition. The amount of thickener to be added is sufficient to retard flow of the stripping composition from the PCB surface, and depends on the chemical composition and physical properties of the thickening agent. The thickener can be added in an amount from about 0 to 5 weight percent of the composition, and preferably from about 0.05 to 5 weight percent, and more preferably from about 1 to 3 weight percent. Examples of thickening agents which can be used include cellulosic thickeners such as methyl cellulose, available as "Methocel" from Dow Chemical Co., Midland, Mich., ethyl cellulose ethers, hydroxypropyl cellulose, available as "Klucell" form Hercules, Inc., Wilmington, Del.; and hydroxymethyl cellulose; clays such a bentonite clay; starches; gums such as guar gum, xanthan gum, and gum arabic; synthetic polymeric thickeners such as polyvinylpyrrolidone and methyl vinyl ether/maleic anhydride copolymers; and colloidal thickeners such as colloidal alumina and colloidal silica. Preferably, a thixatropic thickener is used. Colloidal silica is presently preferred. One type of colloidal silica that is especially preferred is fumed silica, such as available from the Cabot Corporation under the tradename "Cab-O-Sil." An especially preferred grade of fumed silica is Cab-O-Sil M-5. When Cab-O-Sil M-5 fumed silica is used as a thickening agent, the stripping composition preferably includes from about 1 to 3 weight percent of the fumed silica, with about 2 weight percent being especially preferred.

Stripping compositions of the present invention can be prepared by mixing the components using conventional mixing equipment. The order of addition is of no particular importance; although it is preferred that the thickener be added last after the other components have been thoroughly mixed. Further, when a solid grade polyalkylene glycol is employed, it is preferred that the solid grade polyalkylene glycol be dissolved in the solvent and/or the cosolvent, before addition of the remaining components.

The stripping composition can be employed by brushing the composition over the conformal coating on the PCB, and waiting until the conformal coating has been softened. Alternatively, the stripping composition can be employed by spraying or wiping the stripping composition onto the surface to be stripped, or dipping a PCB having a conformal coating into the stripping composition. The length of time required to soften the conformal coating depends on the age, chemical composition and thickness of the conformal coating, the application temperature, and the specific composition of the stripping composition. When the stripping composition is brushed, sprayed or wiped onto the conformal coating, it is preferably applied at a thickness of from about 0.1 to about 0.3 inches. One or more applications of the stripping composition can be employed to loosen the conformal coating, if needed.

The stripping composition of the present invention can be employed at room temperature. If desired, the action of the stripping composition can be accelerated by applying it at an elevated temperature, up to about 60 degrees Celsius. Preferably, the stripping composition is employed at a temperature substantially below the flash point of the stripping composition. The flash point of the stripping composition depends on the amount and nature of the components, especially the solvent and cosolvent employed, and preferably is no lower than about 100 degrees Fahrenheit. At room temperature, the length of time required to soften the conformal coating can vary from less than a minute to several hours or more. Typically, when the conformal coating is a urethane-based material, and has a thickness of about 1–7 mil, the length of time required to soften the conformal coating is about 10–20 minutes. After the conformal coating has been softened, it can be removed mechanically, as by brushing, scraping, with the use of high pressure water jets or the like, and the PCB can be rinsed using water and dried.

A stripping composition (Composition I) according to the present invention can be prepared as follows:

| Component | Percent by Weight |
|---|---|
| d-limonene | 18 |
| monoethanolamine | 9 |
| aromatic distilled spirits | 18 |
| dipropylene glycol monomethyl ether | 30 |
| polyethylene glycol 300 | 23 |
| fumed silica | 2 |

The above stripping composition is prepared by mixing all ingredients but the fumed silica in a stainless steel vat using a mechanical mixer for 5 minutes. The fumed silica is then added with additional stirring for 4 hours. The resultant stripping composition has the consistency of a light syrup.

As an example of the use of the present invention, a stripping composition according to composition I is prepared, and applied to a urethane conformal coating on the surface of a PCB. Composition I is applied by spraying using hand squeeze bottles or low pressure air spray nozzles to give a thickness of about 1/16 inches. After about 20 minutes, the polyurethane conformal coating has softened, and the softened composition can be easily removed mechanically by water spray.

Various modifications can be made in the details of the various embodiments of the composition of the present invention, all within the scope and spirit of the invention and defined by the appended claims.

We claim:

1. A stripping composition for urethane conformal coatings, the stripping composition consisting essentially of:
   a) from about 5 to 50 weight percent of a terpene having at least 10 carbon atoms;
   b) from about 3 to 15 weight percent of an organic amine accelerator;
   c) from about 8 to 32 percent by weight of a hydrocarbon solvent;
   d) from about 20 to 40 weight percent of a glycol ether coupling agent; and
   e) from about 13 to 35 weight percent of a polyalkylene glycol.

2. A stripping composition according to claim 1 wherein the terpene is d-limonene.

3. A stripping composition according to claim 1 wherein the organic amine accelerator is monoethanolamine.

4. A stripping composition according to claim 1 wherein the solvent is aromatic distilled spirits.

5. A stripping composition according to claim 1 wherein the glycol ether coupling agent is dipropylene glycol monomethyl ether.

6. A stripping composition according to claim 1 wherein the polyalkylene glycol is a polyethylene glycol having an average molecular weight of from about 150 to 1000.

7. A stripping composition according to claim 1 further comprising a thickening agent.

8. A stripping composition for urethane conformal coatings, the stripping composition consisting essentially of:
   a) from about 8 to 28 weight percent d-limonene;
   b) from about 6 to 12 weight percent monoethanolamine;
   c) from about 8 to 32 weight percent aromatic distilled spirits;
   d) from about 25 to 28 weight percent dipropylene glycol monomethyl ether;
   e) from about 18 to 30 weight percent polyethylene glycol having an average molecular weight of from about 150 to 1000; and f) from about 1 to 3 weight percent fumed silica.

9. A stripping composition for urethane conformal coatings, the stripping composition consisting essentially of:
   a) about 18 weight percent d-limonene;
   b) about 9 weight percent monoethanolamine;
   c) about 18 weight percent aromatic distilled spirits;
   d) about 30 weight percent dipropylene glycol monomethyl ether;
   e) about 23 weight percent polyethylene glycol having an average molecular weight of about 300; and
   f) about 2 weight percent fumed silica.

10. A process for stripping a urethane conformal composition from the surface of a printed circuit board, the process comprising:
   a) applying to the conformal coating a coating of a stripping composition comprising:
      (1) from about 5 to 50 weight percent of a terpene having at least 10 carbon atoms;
      (2) from about 3 to 15 weight percent of an organic amine accelerator;
      (3) from about 8 to 32 percent by weight of a hydrocarbon solvent;
      (4) from about 20 to 40 weight percent of a glycol ether coupling agent; and
      (5) from about 13 to 35 weight percent of a polyalkylene glycol;
   b) waiting until the stripping composition has softened the conformal coating; and
   c) removing the softened conformal coating mechanically.

11. A process according to claim 10 wherein the terpene is d-limonene.

12. A process according to claim 10 wherein the organic amine accelerator is monoethanolamine.

13. A process according to claim 10 wherein the solvent is aromatic distilled spirits.

14. A process according to claim 10 wherein the glycol ether coupling agent is dipropylene glycol monomethyl ether.

15. A process according to claim 1 wherein the polyalkylene glycol is a polyethylene glycol having an average molecular weight of from about 150 to 1000.

16. A process according to claim 10 further comprising a thickening agent.

17. A process according to claim 10 wherein the stripping composition comprises:
   a) from about 8 to 28 weight percent d-limonene as the terpene;
   b) from about 6 to 12 weight percent monoethanolamine as the organic amine accelerator;
   c) from about 8 to 32 weight percent aromatic distilled spirits as the hydrocarbon solvent;
   d) from about 25 to 28 weight percent dipropylene glycol monomethyl ether as the glycol ether coupling agent;
   e) from about 18 to 30 weight percent polyethylene glycol having an average molecular weight of from about 150 to 1000 as the polyalkylene glycol; and further comprising
   f) from about 1 to 3 weight percent fumed silica.

18. A process according to claim 10 wherein the stripping coating is applied at a thickness of from about 0.1 to about 0.3 inches.

19. A process according to claim 10 wherein the softened coating is removed mechanically by a stream of water.

* * * * *